United States Patent [19]

Buchanan

[11] 4,213,120
[45] Jul. 15, 1980

[54] CCD DIGITAL-TO-ANALOG CONVERTER
[75] Inventor: James E. Buchanan, Bowie, Md.
[73] Assignee: Westinghouse Electric Corp., Pittsburgh, Pa.
[21] Appl. No.: 883,440
[22] Filed: Mar. 6, 1978
[51] Int. Cl.² ............................................ H03K 13/02
[52] U.S. Cl. .......................... 340/347 DA; 307/221 D
[58] Field of Search ............... 340/347 DA, 347 AD, 340/347 M; 307/221 D, 309, 310

[56] References Cited
U.S. PATENT DOCUMENTS

| | | | |
|---|---|---|---|
| 3,056,085 | 9/1962 | James | 340/347 AD |
| 3,140,481 | 7/1964 | Hoffman | 340/347 AD |
| 3,449,741 | 6/1969 | Egerton | 340/347 C |
| 3,594,782 | 7/1971 | Carbrey | 340/347 DA |
| 3,665,458 | 5/1972 | Mulkey | 340/347 DA |
| 3,836,906 | 9/1974 | Ando | 340/347 DA |
| 3,885,167 | 5/1975 | Berlund | 307/221 D |
| 3,906,488 | 9/1975 | Suarez-Gartner | 340/347 DA |
| 3,930,255 | 12/1975 | Means | 340/347 AD |
| 3,947,705 | 3/1976 | Emmons | 307/221 D |
| 4,072,938 | 2/1978 | Buchanan | 340/347 AD |
| 4,072,939 | 2/1978 | Heller | 340/347 AD |
| 4,087,812 | 5/1978 | Terman | 340/347 DA |

OTHER PUBLICATIONS

MOK "Solid–State Electronics", vol. 17, 1974, pp. 1147–1154.

Primary Examiner—Charles D. Miller
Attorney, Agent, or Firm—B. W. McGee

[57] ABSTRACT

A digital-to-analog converter is described in which a first circuit including charge storage means provides charge packets corresponding to digitally weighted samples of an analog reference voltage. A predetermined pattern of digital signals cooperates with gating means to determine which charge storage devices in a second circuit will be charged with the charge packets stored in the first circuit. In one embodiment, the selected charges stored in the second circuit are shifted serially, accumulated, and sensed to provide an analog output signal. In another embodiment, the selected charges stored in the second circuit are accumulated and sensed.

9 Claims, 8 Drawing Figures

CCD DIGITAL-TO-ANALOG CONVERTER

BACKGROUND OF THE INVENTION

1. Field of the Invention:

This invention relates to digital-to-analog conversion circuits and particularly to digital-to-analog conversion circuits using charge coupled devices.

2. Description of the Prior Art:

There are several well-known types of conventional digital-to-analog (D/A) converters that have been used or proposed for various applications. One type includes a circuit in which a plurality of capacitors are charged by digitally weighted voltages. In one embodiment, the capacitors are then placed in series to provide an analog output voltage. In a particular embodiment of this type of D/A converter circuit, resistors are used to provide the digitally weighted voltages. However, a disadvantage of this type of D/A converter is that in a discrete implementation, assembly of the individual component parts into a unitary circuit is required. This discrete assembly is costly and time consuming to manufacture. Additionally, the circuits employing discrete elements are subject to more frequent failures and relatively high power consumption making them undesirable in applications requiring high reliability and low maintenance. Another disadvantage is that in an integrated implementation, resistors are difficult to construct because values must be precisely selected. Furthermore, the use of resistors increase device power consumption.

Charge storage devices other than capacitors can be used to implement D/A converters, for example, charge transfer devices (CTD) such as charge coupled devices (CCD) and bucket brigade devices (BBD). A primary advantage of CTD is their inherent simplicity and cost effectiveness. The CCD, for example, is very basic in structure, being defined substantially by a homogeneously doped substrate with potential wells formed therein, p-n junctions being required only at the input and output. This construction requires much less area than fabrication of an equivalent capacitor circuit, for example, with the accompanying benefits of greater yield, less cost, and, of course, smaller devices.

SUMMARY OF THE INVENTION

Briefly, in accordance with the present invention, a digital-to-analog (D/A) converter is provided wherein an analog output signal corresponds to a portion of an analog reference signal. A pattern of binary input signals determines the portion.

More specifically, a first charge storage means successively divides the reference signal, preferably digitally, in response to a sequence of clock pulses. A charge flow control means transfers selected ones of the digitally weighted charges to a second charge storage means in response to a shift clock pulse. The charges transferred are selected by gating the pattern of binary input signals with the clock pulse. The selected charges are accumulated to provide the output analog signal, which is a fraction of the reference signal.

In one aspect of the present invention, the pattern of binary input signals is applied in parallel. The first charge storage means includes a plurality of pairs of charge storage wells coupled together. Charge flow control means is associated with each of the pairs of storage wells, to each of which flow control means is coupled one of the binary input signals. In one embodiment, the second charge storage means includes a plurality of charge storage wells. One of each of the pairs of storage wells in the first storage means is coupled to a storage well in the second storage means. In another embodiment, the second charge storage means includes a single charge storage well. One of each of the pairs of storage wells in the first storage means is coupled in parallel to the single charge storage well in the second storage means.

In another aspect of the invention, the pattern of binary input signals is applied serially. The first charge storage means includes a pair of charge storage wells, coupled to one of which is a discharge means, for example, a resistor in series with a switch. The second charge storage means is coupled to the storage well in the second charge storage means. Charge flow control means which controls the transfer of charge from the first to the second charge storage means includes gating means, to the input of the shift clock pulse which is coupled and means for serially applying the binary input signals. In a sequence of operation, the reference signal is divided by the pair of storage wells. The shift clock pulse transfers the charge in one of the pairs of wells depending on the presence of a particular binary signal. The charge in one of the pairs of wells is drained through the discharge means to the substrate, the charge in the other of the pair of wells is divided between them and the sequence is repeated for as many times as there are number of binary signals.

DESCRIPTION OF THE PREFERRED EMBODIMENT

Figure 1:
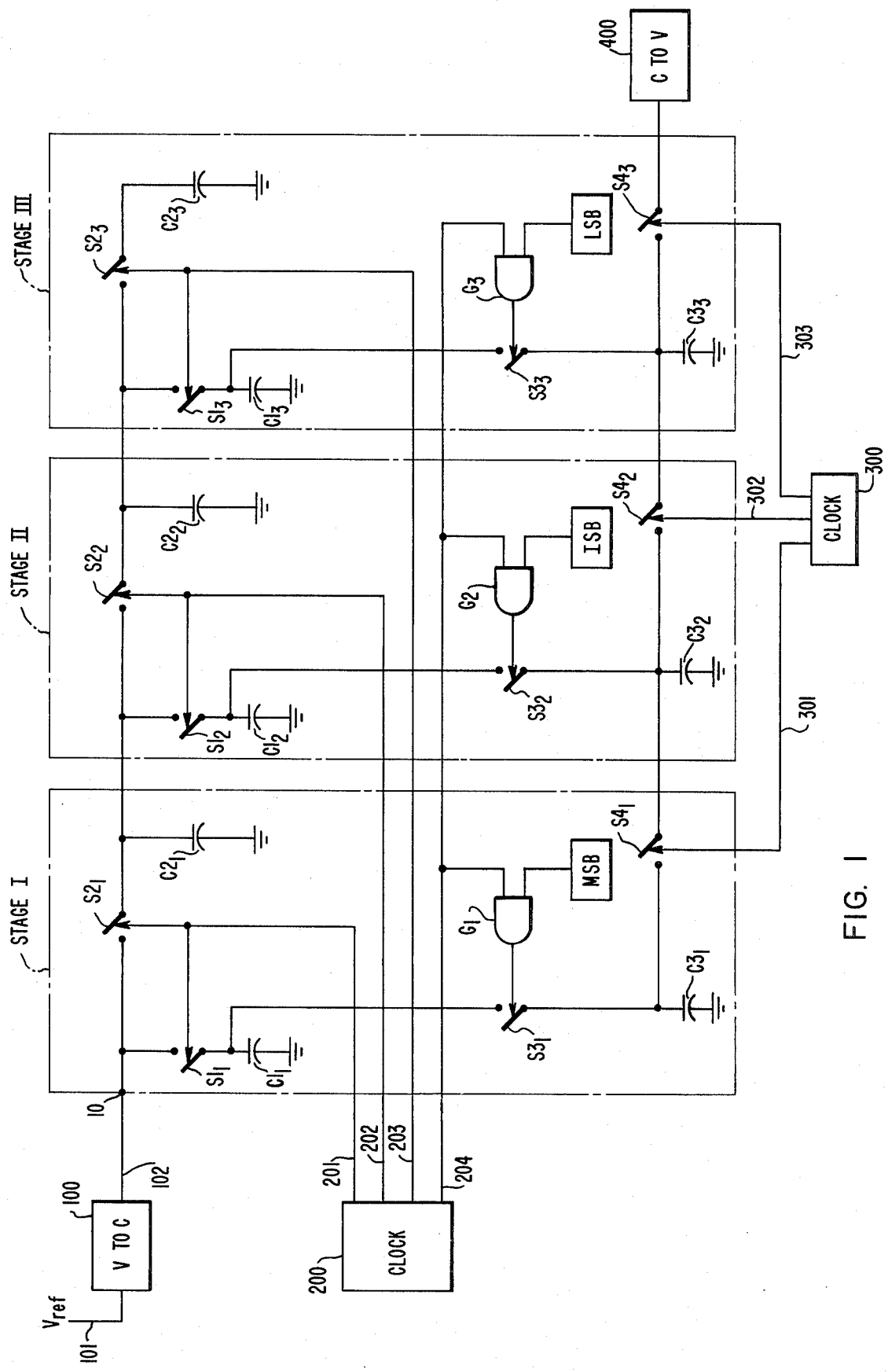
FIG. 1 is schematic representation of a first embodiment of a CCD D/A converter according to the present invention.

Referring to FIG. 1, a schematic representation of a charge coupled device (CCD) digital-to-analog (D/A) converter according to one embodiment of the invention is illustrated to include the details of the three identical stages which are enclosed by the dashed lines, referred to as Stage I, Stage II, and Stage III. To each stage is applied a binary bit from a binary pattern. For example, binary bits MSB, ISB, and LSB form a binary pattern and are applied to identical stages, Stages I, II, and III, respectively, at inputs 102, 202, and 302, respectively. As shown in FIG. 1, the binary pattern consisting of MSB, ISB, and LSB is representative of a numerical value in the number base 2 where MSB is the most significant bit or digit, TSB is an intermediate bit or digit, and LSB is the least significant bit or digit, significance being measured by weight accorded to the bits. For instance, in FIG. 1, the weight given to MSB, ISB, and LSB are, respectively, $2^0$, $2^1$, and $2^2$ or 1, 2, and 4. Though three stages are shown, more or fewer stages can be used depending on the particular application, i.e., depending on the number of binary bits desired to be processed. A stage is needed for each such binary bit. However, for a D/A converter according to the present invention having more than 10 stages, charge transfer inefficiencies and charge refresh problems may cause a deterioration in device performance.

Similar components in each stage are referred to by an appropriate subscript corresponding to the Roman numerical designation of the stage. For example, Stage I includes well-known storage devices such as MOS capacitors or CCD potential wells referred to as $C1_1$, $C2_1$, and $C3_1$, and Stage II includes well-known storage devices such as MOS capacitors or CCD storage wells referred to as $C1_2$, $C2_2$, and $C3_2$.

Stage I also includes an electronic switch S1, coupled between a voltage-to-charge converter 100 and a grounded storage device $C1_1$. An electronic switch S2, is coupled between the converter 100 and a grounded storage device $C2_1$. A clock 200 operates the switch $S1_1$ and $S2_1$ via a line 201. One side of the storage device $C1_1$ is coupled to a storage device $C3_1$ via an electronic switch $S3_1$. A gate $G_1$ operates the switch $S3_1$ in response to a pulse input from the clock 200 via a line 204 and the binary bit MSB. An electronic switch S4, couples capacitor $C3_1$ of Stage I to capacitor $C3_2$ of Stage II and is operated by a clock 300 via a line 301. One side of storage device $C2_1$ is coupled to the input of Stage II. Charge storage devices in groups C1, C2 and C3 of Stages I, II, and III, respectively, may be MOS capacitors or they may be potential wells in a charge coupled device. Electronic switches S1, S2, S3, and S4 of Stages I, II, and III may be well-known potential well electrodes used in CCD integrated circuits. The converter 100 may be, for example, a CCD diffusion diode.

Figure 2:
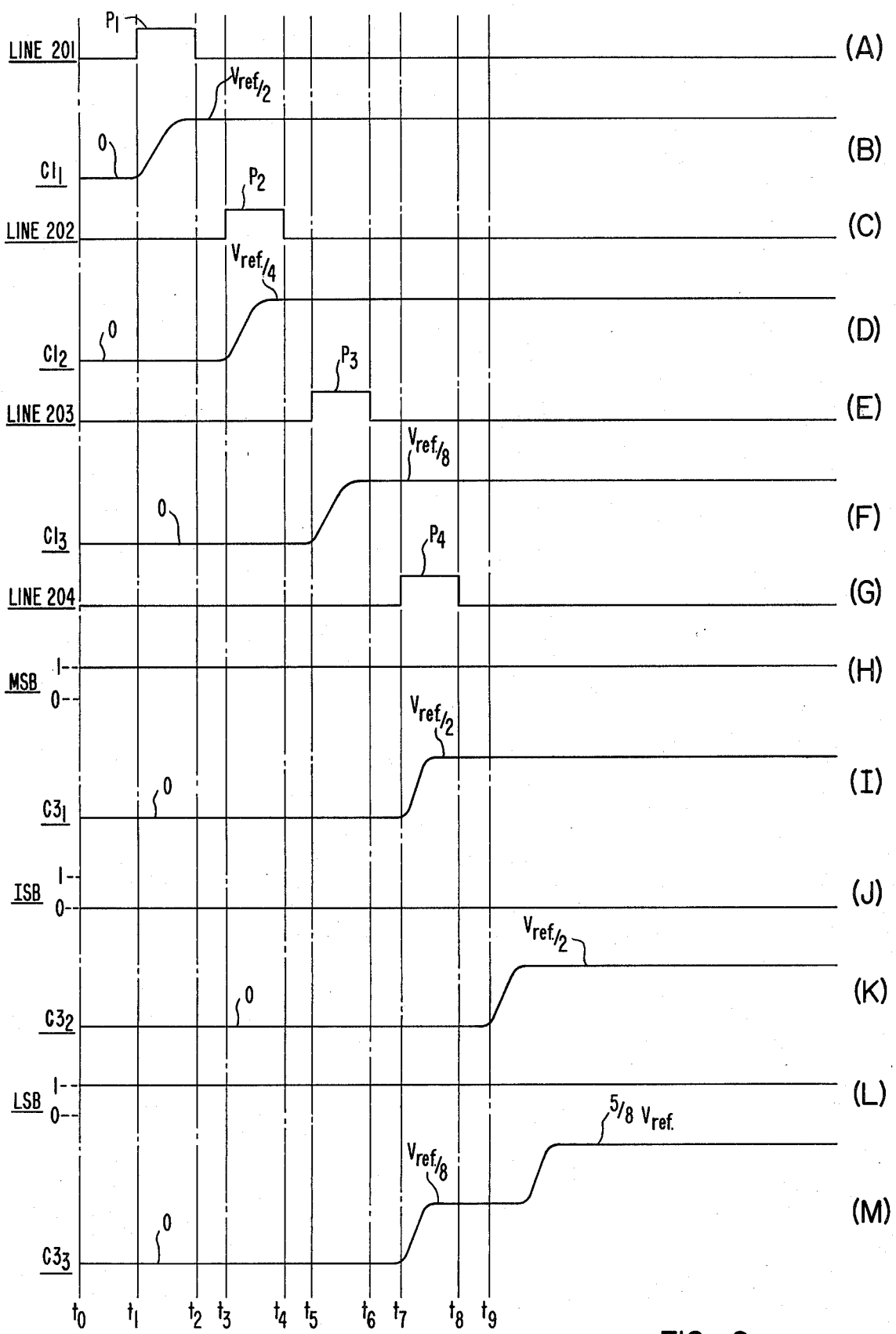
FIGS. 2A through 2M shows a set of timing diagrams for the circuit of FIG. 1.

A description of the operation of the embodiment of the present invention shown in FIG. 1 will be given with the aid of the timing diagrams of FIG. 2. The timing diagrams of FIG. 2 are assigned reference characters corresponding to similarly referenced elements in FIG. 1. An analog reference voltage $V_{ref}$ is applied to converter 100 by a line 101. A line 102 carries charge indicative of $V_{ref}$ to the input 10 of Stage I. To digitally divide $V_{ref}$, the potential wells C1 and C2 of Stages I, II and III should be of equal charge storage capacity. In response to clock pulses generated by the clock 200 on lines 201, 202, and 203, reference charges are generated in each stage equivalent to one-half of the reference charge in the preceding stage. In particular, it is desirable to store reference charges indicative of $V_{ref}/2$, $V_{ref}/4$, and $V_{ref}/8$ on storage devices $C1_1$, $C1_2$, and $C1_3$, respectively. More particularly, at a time $t_0$ all the switches S1, S2, S3 and S4 are open. At a later time $t_1$, the clock 200 generates a pulse $P_1$ on line 201 as shown in timing diagram 201 of FIG. 2A, which pulse $P_1$ is effective to close switches $S1_1$, and $S2_1$. The charge on line 102 will be transferred to the storage devices $C1_1$ and $C2_1$. If the storage devices $C1_1$ and $C2_1$ are of equal storage capacity, the charge stored therein will be equal, i.e., $C1_1$ and $C2_1$ will each store charge indicative of $V_{ref}/2$. Such a reference charge in $C1_1$ is shown by timing diagram $C1_1$ in FIG. 2B. At a later time $t_2$, the switches $S1_1$ and $S2_1$ open in response to the end of the pulse $P_1$.

At a later time $t_3$, clock 200 generates a pulse $P_2$ on line 202 as shown in timing diagram 202 of FIG. 2C, which pulse $P_1$ is effective to close switches $S1_2$ and $S2_2$. The charge in storage device $C2_1$ will be transferred to storage devices $C1_2$ and $C2_2$. If the storage devices $C1_2$ and $C2_2$ are of equal storage capacity, the charge stored therein will be equal, i.e., storage devices $C1_2$ and $C2_2$ will each store charge indicative of $V_{ref}/4$. Such a reference charge in $C1_2$ is shown in diagram $C1_2$ of FIG. 2D. At at time $t_4$, the switches $S2_1$ and $S2_2$ open in response to the end of pulse $P_2$.

Figure 3:
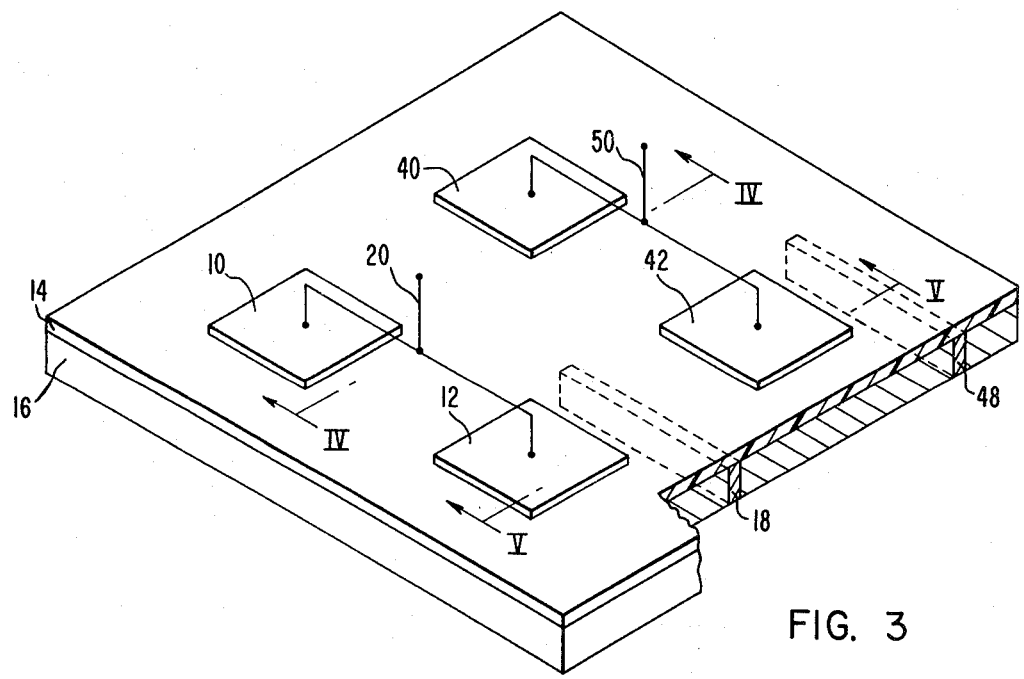
FIG. 3 shows a simplified split electrode arrangement according to a feature of the present invention.
Figure 4:
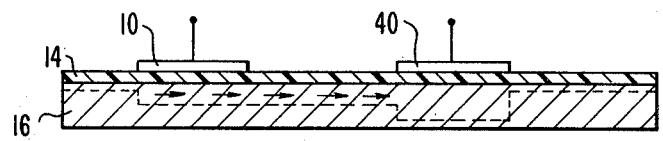
FIG. 4 shows a side view of the arrangement of FIG. 3.
Figure 5:
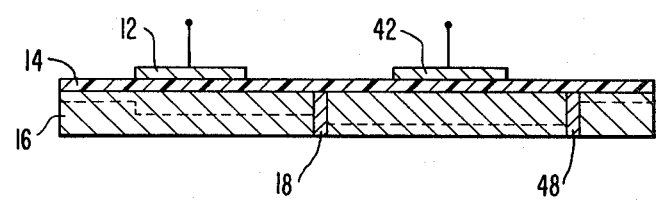
FIG. 5 shows a different side view of the arrangement of FIG. 3.

At a time $t_5$, clock 206, generates a pulse $P_3$ on line 203 as shown in diagram 203 of FIG. 2E, which pulse $P_3$ is effective to close switches $S1_3$ and $S2_3$. The charge in storage device $C2_2$ will be transferred to storage devices $C1_3$ and $C2_3$. If the storage devices $C1_3$ and $C2_3$ are of equal storage capacity, the charge stored therein will be equal, i.e., storage devices $C1_3$ and $C2_3$ will each store charge indicative of $V_{ref}/8$. Such a reference charge in $C1_3$ is shown in diagram $C1_3$ of FIG. 2F. At at time $t_6$, the switches $S1_3$ and $S2_3$ open in response to the end of pulse $P_3$. One method of implementing in a CCD such a configuration as described above where charge is transferred from stage to successive stage is by split electrode weighting of CCD wells as described by Bailey in U.S. Pat. No. 3,877,056. The relative area ratio of two portions of an electrode define the desired weighting. If the areas of the two electrode portions are equal, binary reference charge generation as hereinbefore described will result. FIG. 3 shows a simplified split electrode arrangement wherein split electrodes 10 and 12 coupled together for charge shifting and control purpose by control line 20 and split electrodes 40 and 42 coupled together for charge shifting and control purpose by control line 50 lay upon an insulator 14, which insulator 14 is deposited upon a semiconductor substrate 16. Control lines 20 and 50 would be coupled to one of the clock lines 201 through 203 shown in FIG. 1. In addition, p-n junctions 18 and 20 are formed in the substrate 16 partially surrounding electrodes 12 and 42, respectively, in order to prevent the divided charge in the associated potential well from being shifted out upon application of a pulse from clock 200, for example. Only the charge stored in the potential well created under electrode 10 is shifted out, one-half of which charge is stored in the potential well created under electrode 40 and one-half of which charge is stored in the potential well created under electrode 42. The use of the electrodes 10, 12, 40, and 42 is only illustrative of the conceptual operation of the present invention. It is to be understood that, in actual practice, the electrodes 10, 12, 40 and 42 of FIG. 3 consist of 2, 3, or 4 separate electrodes controlled by a gated clock with, correspondingly, 2, 3, or 4 phases in order to control the flow of charge with logic signals, for example, as is common practice in implementing charge coupled device circuits. The p-n junctions 18 and 48 can be formed in the substrate 16 by any conventional diffusion method. FIG. 4 shows a side view of the device of FIG. 3 taken along the lines IV-IV and looking in the direction of the arrows. FIG. 5 shows a side view of the device of FIG. 3 taken along the line V—V and looking in the direction of the arrows. Taken together, FIGS. 4 and 5 illustrate the movement of charge from the split electrodes 10 and 12 of FIG. 3 to the electrodes 40 and 42 of FIG. 3 upon application of a pulse from clock 200. In FIG. 5, charge in the well under electrode 12 is blocked from flowing into the well under electrode 42 by the p-n junction 18. In FIG. 4, however, charge in the well under electrode 10 is free to flow into the well under electrode 40 and the well under electrode 42 of FIG. 5. In turn, the p-n junction 48 of FIG. 5 prevents the charge in the well under electrode 42 from shifting forward. Only the charge in the well under electrode 40 is free to be shifted. In a like manner, the reference charge $V_{ref}$ is continually divided in such a binary manner in order to obtain the desired digitally weighted reference charges in $C1_1$, $C1_2$, and $C1_3$ of FIG. 1. The wells under the electrodes 10, 12, 40, and 42 of FIG. 3 correspond, for example, to the charge storage devices $C2_2$, $C1_2$, $C2_3$, and $C1_3$, respectively.

At a time $t_7$, clock 200 generates a pulse $P_4$ on line 204 as shown in diagram 204 of FIG. 2G. Certain ones of the gates $G_1$, $G_2$, and $G_3$ will then conduct in response to a binary 1 applied thereto by the associated binary bits MSB, ISB, and LSB, respectively. The associated switches $S3_1$, $S3_2$, and $S3_3$, will close in response to a conducting AND gate. For example, a binary value of 1 applied to gate $G_1$ by binary bit MSB will cause gate $G_1$ to conduct and switch $S3_1$ to close. Charge stored in storage device $C1_1$ will then be transferred to the storage device $C3_1$. Such a reference charge in $C3_1$ is shown in diagram $C3_1$ of FIG. 2I. Charge stored in charge storage devices $C1_2$ and $C1_3$ will be transferred to storage devices $C3_2$ and $C3_3$, respectively, depending upon which of the binary bits ISB and LSB, respectively applies a logic "1" to their associated gates. For example, where a logic "0" is applied to the gate $G_2$ by the binary bit ISB and a logic "1" is applied to the gate $G_3$ by the binary bit LSB, charge stored in storage device $C1_2$ will not be transferred to storage device $C3_2$ because the logic "0" applied to gate $G_2$ and causes $G_2$ not to conduct and the switch $S3_2$ will not close. The charge in storage device $C3_2$ is shown in timing diagram $C3_2$ of FIG. 2K. The charge stored device $C1_3$ will be transferred to the storage device $C3_3$ since the logic "1" applied to gate $G_3$ will cause it to conduct and close switch $S3_3$. The charge in storage device $C3_3$ is shown in timing diagram $C3_3$ of FIG. 2M. At a later time $t_8$, the switches $S1_3$, $S2_3$, $S3_3$ will open or remain open as the case may be in response to the end of pulse $P_4$.

At a later time $t_9$, the clock 300 generates pulses on lines 301, 302, and 303 such that charges contained in storage devices $C3_1$ and $C3_2$ are transferred to storage device $C3_3$. The charge in storage device $C3_1$ is shifted into storage device $C3_2$ and storage device $C3_2$ charges to a charge indicative of $V_{ref}/2$ since there was initially no charge in the well. Timing diagram $C3_2$ of FIG. 2K depicts this result. Some time later, when the charge in storage device $C3_2$ is shifted into storage device $C3_3$, the storage device $C3_3$ in FIG. 1 charges to a charge indicative of $V_{ref}/2 + V_{ref}/8$ or equivalently, $\S V_{ref}$ which is the analog charge corresponding to the binary input 101; where MSB=1, ISB=0, and LSB=1.

A charge-to-voltage converter 400 senses or detects the charge in storage device $C3_3$ and can be implemented in any conventional way such as the current sensing, voltage sensing, or nondestructive sensing methods described in The ABC's of CCDs in the Apr. 2, 1975 issue of *Electronic Design* 8.

The description of the charge transfers in the present invention is simplified to facilitate understanding of its operation. In a practical device, the charge transfers may be slightly more complex in that if a logic "1" is continuously applied, to a particular gate, for example gate $G_2$ of FIG. 1, charge is transferred into storage device $C3_2$ during each pulse or clock period $P_4$ shown on line 204 in FIG. 2 from storage device $C1_2$ and is transferred out of it into storage device $C3_3$ during each pulse or clock period $P_{11}$ shown on line 302 in FIG. 10.

Figure 6:
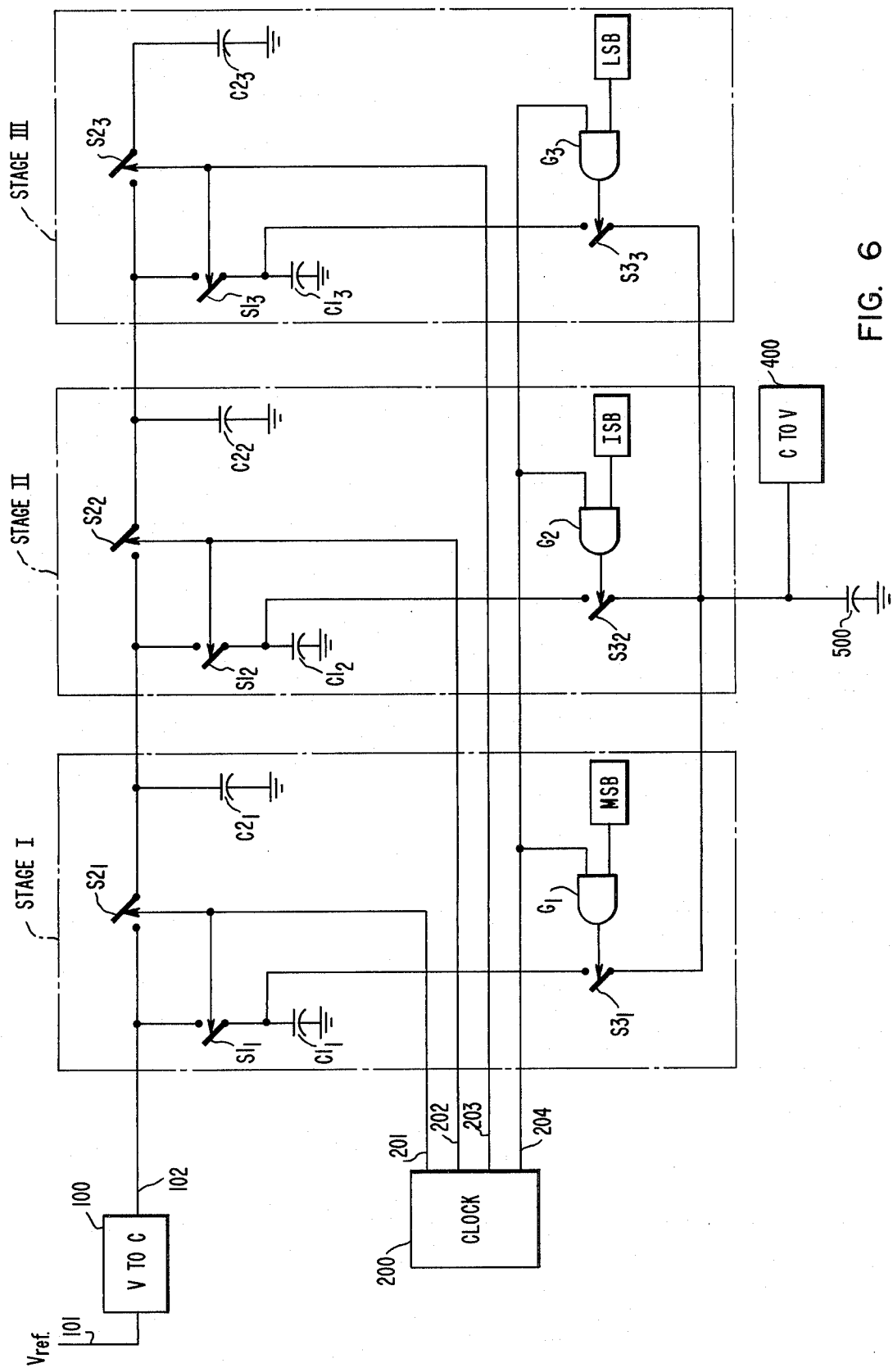
FIG. 6 shows a schematic representation of a second embodiment of a CCD D/A converter according to the present invention.
Figure 7:
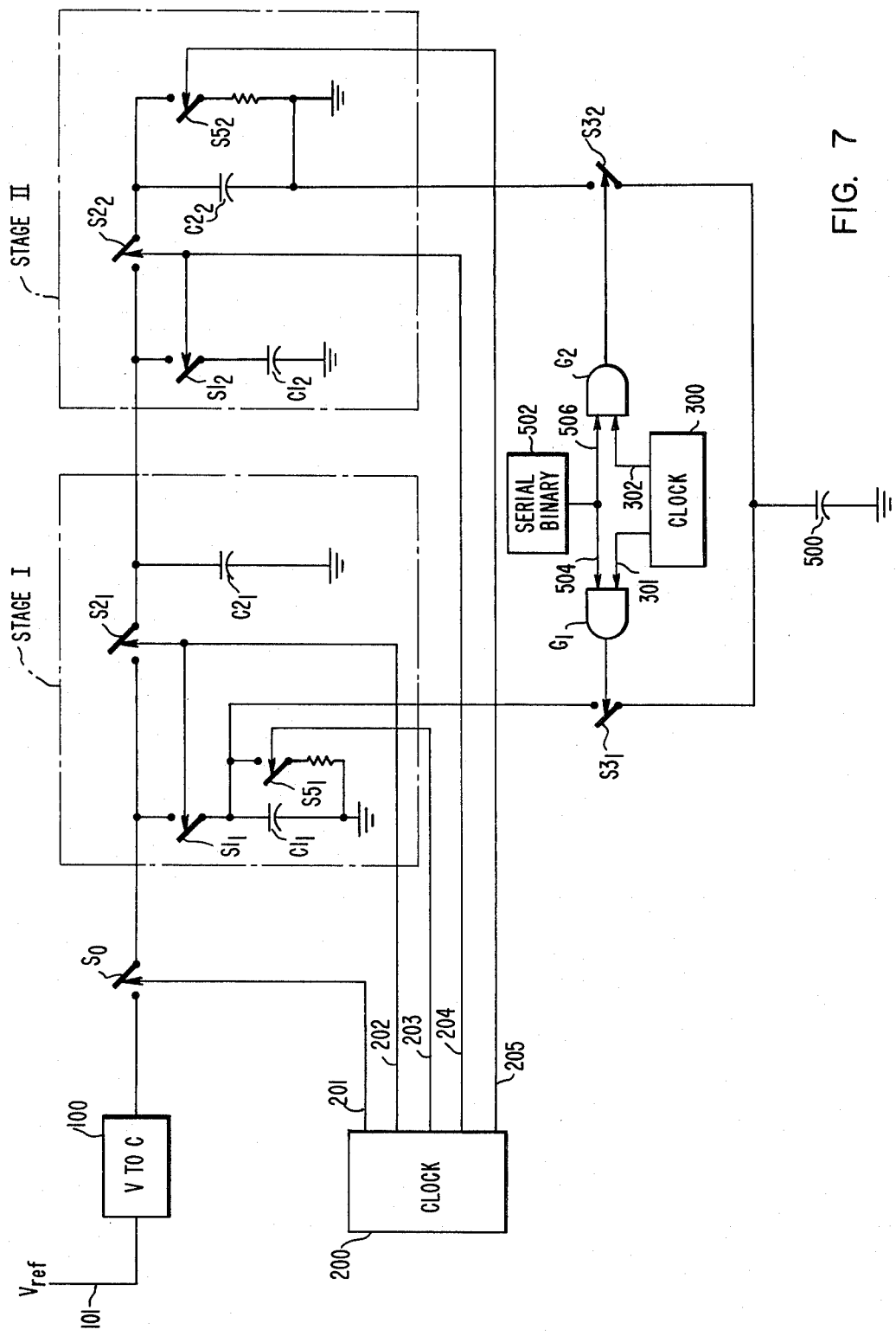
FIG. 7 shows a schematic representation of a third embodiment of a CCD D/A converter according to the present invention.
Figure 8:
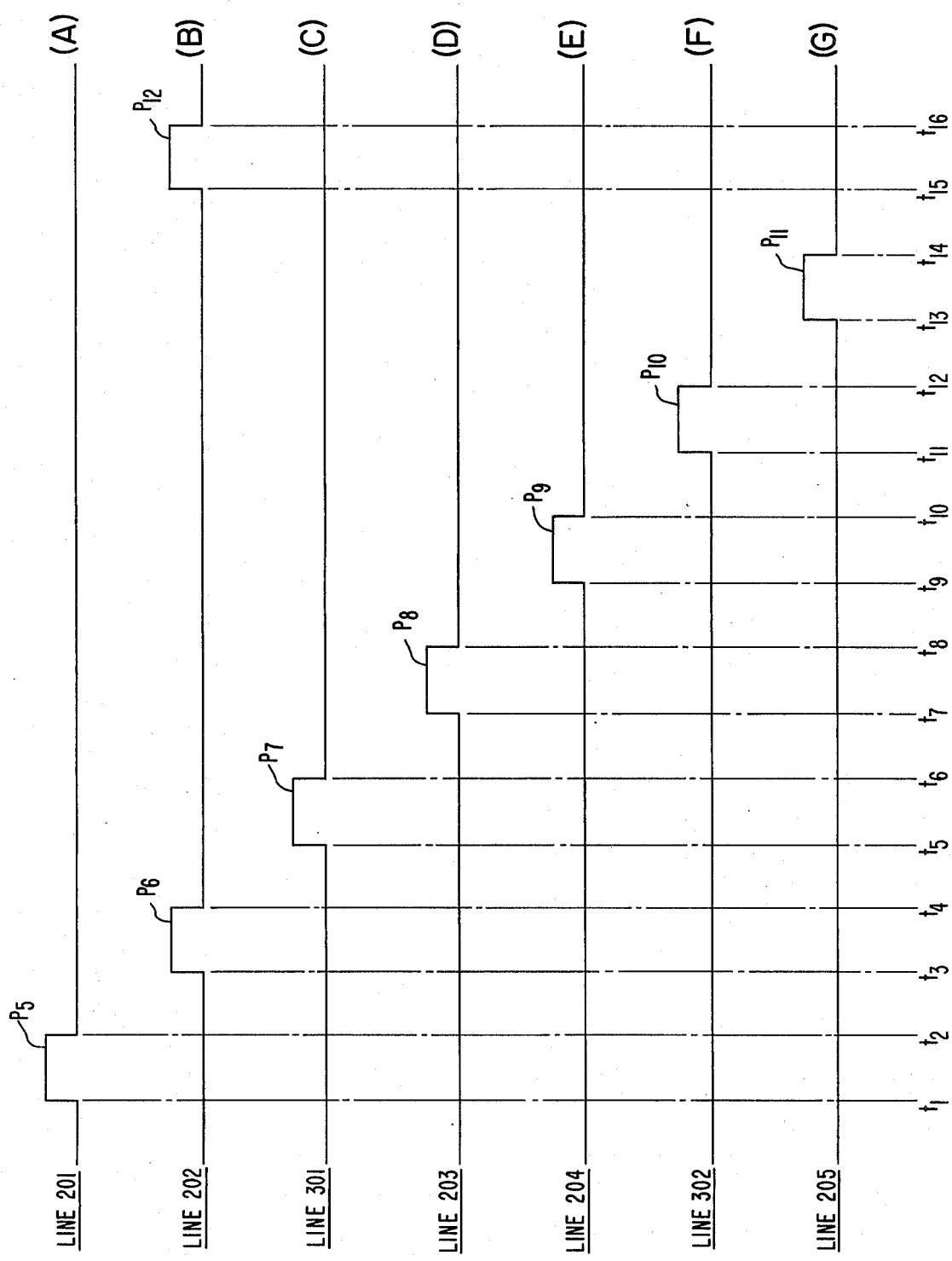
FIG. 8A through 8G shows a set of timing diagrams for the circuit of FIG. 7.

FIG. 6 shows another embodiment of the present invention wherein selected ones of the digitally weighted reference charges in devices S1 of Stages I, II, and III are shifted into a single charge storage device 500 depending on which of the switches S3 are closed by the gates G.

What I claim is:

1. A digital-to-analog converter having an input and an output, said converter comprising:
   (a) a plurality of identical sequential electronic stages each having an input and first and second outputs, said plurality of stages including a first stage, at least one intermediate stage, and a last stage, the inputs of each of said intermediate stages coupled to the first output of the immediately preceding stage, the first output of each of said intermediate stages coupled to the input of the immediately succeeding stage;
   (b) means for supplying an analog reference signal to the input of said first stage;
   (c) a first charge storage means associated with each of said plurality of stages, said first charge storage means including potential well means;
   (d) each of said plurality of stages having:
      (1) a second charge storage means including first and second potential wells for dividing charge in said second charge storage means,
      (2) transfer means for transferring charge in said first potential well to the associated first charge storage means in accordance with a predetermined digital signal, said transfer means including an AND gate having at least two inputs and including means for applying a digital signal to one of the inputs of said AND gate;
   (e) sensing means coupled to the output of said converting means for sensing and measuring charge in said first charge storage means.

2. A digital-to-analog converter according to claim 1 wherein said sensing means includes means for shifting and accumulating charge in each of said first charge storage means.

3. A digital-to-analog converter comprising:
   a. means for supplying an analog reference signal;
   b. first charge storage means having a first charge flow control means;
   c. first clocking means for operating said first charge flow control means to store in said first charge storage means charge packets corresponding to predetermined fractions of said reference signal;
   d. means for supplying a plurality of digital signals having a predetermined pattern;
   e. second charge storage means including a pair of charge storage potential wells coupled together for dividing said reference signal by a predetermined number, said second charge-storage means having a second charge flow control means;
   f. selecting means including second clocking means for operating said second charge flow control means to transfer to said second charge storage means selcted ones of the charge packets in said first charge storage means in response to the predetermined pattern of said digital signals to provide a charge corresponding to the predetermined pattern of said digital signals; and g. sensing means coupled to said second charge storage means for sensing said charge corresponding to the predetermined pattern of said digital signals.

4. A digital-to-analog converter according to claim 3 wherein the charge storage capacity of each one of said pair of charge storage potential wells is equal.

5. A digital-to-analog converter according to claim 3 wherein said pairs of charge storage wells each includes:

an oxide section overlying a substrate section, a pair of electrodes overlying said oxide;

a potential barrier formed in said substrate partially surrounding a potential well formed under one of said electrodes such that charge flow out of said potential well is substantially eliminated.

6. A digital-to-analog converter according to claim 5 wherein the surface area covered by each one of said pair of electrodes is equal.

7. A digital-to-analog converter comprising:

a. means for supplying an analog reference signal;

b. first charge storage means including a charge storage well in a charge coupled device and a circuit breaking means for coupling said charge storage well to said sensing means, said first charge storage means having a first charge flow control means;

c. first clocking means for operating said first charge flow control means to store in said first charge storage means charge packets corresponding to predetermined fractions of said reference signal;

d. means for supplying a plurality of digital signals in parallel, said digital signals having a predetermined pattern;

e. second charge storage means having a second charge flow control means;

f. selecting means including second clocking means for operating said second charge flow control means to transfer to said second charge storage means selected ones of the charge packets in said first charge storage means in response to the predetermined pattern of said digital signals to provide a charge corresponding to the predetermined pattern of said digital signals; and g. sensing means coupled to said second charge storage means for sensing said charge corresponding to the predetermined pattern of said digital signals.

8. A digital-to-analog converter according to claim 7 wherein said transfer means includes logic gating means for governing transfer of charge from said second charge storage means to said first charge storage means.

9. A digital-to-analog converter according to claim 8 wherein said logic gating means includes logic AND gates having an output for governing transfer of charge and having two inputs, means for coupling one of the inputs of said AND gate to a clock, and means for coupling the other of the inputs of said AND gate to a digital signal.

* * * * *